(12) United States Patent
Baumgartner et al.

(10) Patent No.: US 7,340,704 B2
(45) Date of Patent: Mar. 4, 2008

(54) METHOD AND SYSTEM FOR OPTIMIZED AUTOMATED CASE-SPLITTING VIA CONSTRAINTS IN A SYMBOLIC SIMULATION FRAMEWORK

(75) Inventors: Jason Raymond Baumgartner, Austin, TX (US); Christian Jacobi, Schoenaich (DE); Viresh Paruthi, Austin, TX (US); Kai Weber, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 11/165,455

(22) Filed: Jun. 23, 2005

(65) Prior Publication Data

US 2006/0294481 A1 Dec. 28, 2006

(51) Int. Cl.
*G06F 17/50* (2006.01)
(52) U.S. Cl. .................... 716/5; 716/7; 716/2
(58) Field of Classification Search .............. 716/1, 716/3, 5, 2, 7
See application file for complete search history.

(56) References Cited

U.S. PATENT DOCUMENTS

| | | | |
|---|---|---|---|
| 5,502,661 A | 3/1996 | Glunz | |
| 6,026,222 A * | 2/2000 | Gupta et al. | 716/5 |
| 6,442,561 B1 * | 8/2002 | Gehrke et al. | 707/102 |
| 6,662,189 B2 * | 12/2003 | Oyanagi et al. | 707/102 |
| 6,757,884 B2 | 6/2004 | Mandell et al. | |
| 6,782,511 B1 * | 8/2004 | Frank et al. | 716/1 |
| 6,842,750 B2 | 1/2005 | Andreev et al. | |
| 6,938,049 B2 * | 8/2005 | Kamath et al. | 707/102 |
| 7,065,722 B2 * | 6/2006 | Jain | 716/3 |
| 2002/0144218 A1 * | 10/2002 | Levin et al. | 716/4 |
| 2003/0074640 A1 | 4/2003 | Mandell et al. | |
| 2003/0187815 A1 | 10/2003 | Andreev et al. | |
| 2004/0015799 A1 * | 1/2004 | Jain | 716/5 |
| 2004/0199887 A1 * | 10/2004 | Jain et al. | 716/5 |
| 2006/0122817 A1 * | 6/2006 | Baumgartner et al. | 703/14 |
| 2007/0061765 A1 * | 3/2007 | Jacobi et al. | 716/5 |

* cited by examiner

*Primary Examiner*—Stacy A Whitmore
*Assistant Examiner*—Magid Y. Dimyan
(74) *Attorney, Agent, or Firm*—David A. Mims, Jr.; Dillon & Yudell LLP

(57) ABSTRACT

A method for performing verification is proposed. The method comprises receiving a design and building an intermediate binary decision diagram for the design containing one or more nodal binary decision diagrams. In response to a size of the intermediate binary decision diagram exceeding a size threshold, a node of the design is selected for case-splitting. A first case-splitting is performed upon the selected node of the design to generate a primary constraint for setting the selected node to a primary value. A first constraining is performed on one of the one or more nodal binary decision diagrams with the primary constraint to generate a primary final binary decision diagram, a first verification of the design is performed using the primary final binary decision diagram.

7 Claims, 11 Drawing Sheets

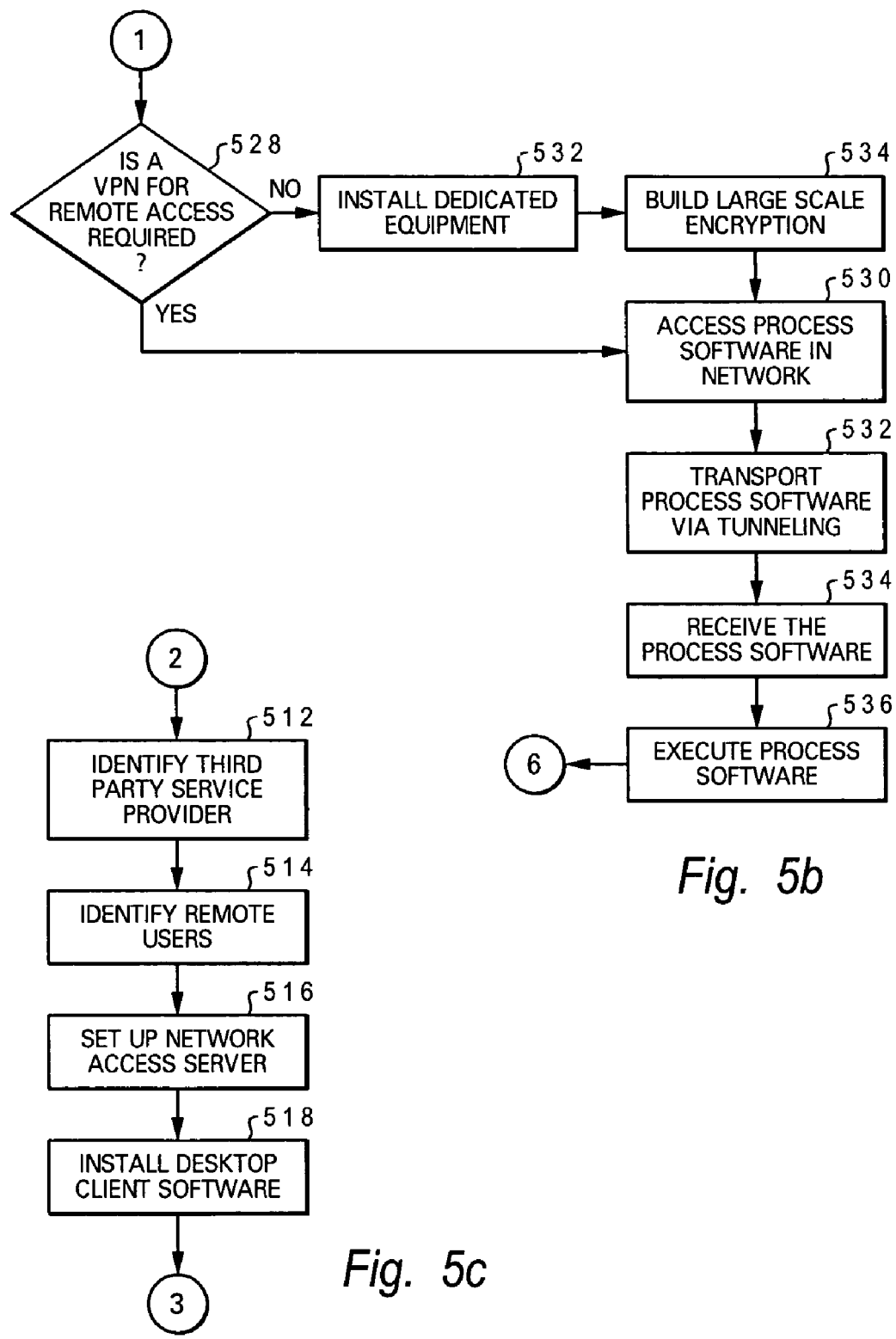

METHOD AND SYSTEM FOR OPTIMIZED AUTOMATED CASE-SPLITTING VIA CONSTRAINTS IN A SYMBOLIC SIMULATION FRAMEWORK

BACKGROUND OF THE INVENTION

1. Field of the Invention

The present invention relates in general to verifying designs and in particular to verifying a logic function in a decision diagram. Still more particularly, the present invention relates to a system, method and computer program product for optimized automated case splitting via constraints in a symbolic simulation framework.

2. Description of the Related Art

Formal and semiformal verification techniques provide powerful tools for discovering errors in verifying the correctness of logic designs. Formal and semiformal verification techniques frequently expose probabilistically uncommon scenarios that may result in a functional design failure. Frequently, formal and semiformal verification techniques provide the opportunity to prove that a design is correct (i.e., that no failing scenario exists).

One commonly-used approach to formal and semiformal analysis for applications operating on representations of circuit structures is to represent the underlying logical problem structurally (as a circuit graph), and then use Binary Decision Diagrams (BDDs) to convert the structural representation into a functionally canonical form.

In such an approach, in which a logical problem is represented structurally and binary decision diagrams are used to convert the structural representation into a functionally canonical form, a set of nodes for which binary decision diagrams are required to be built, called "sink" nodes, are identified. Examples of sink nodes include the output node or nodes in an equivalence checking or a false-paths analysis context. Examples of sink nodes also include targets in a property-checking or model-checking context.

Unfortunately, formal verification techniques require computational resources which are exponential with respect to the size of the design under test. In particular, many formal analysis techniques require exponential resources with respect to the number of state elements in the design under test. Semi-formal verification techniques leverage formal algorithms on larger designs by applying them only in a resource-bounded manner, though at the expense of incomplete verification coverage; generally, coverage decreases as design size increases.

Constraints are often used in verification to prune the possible input stimulus in certain states of the design. For example, a constraint may state "if the design's buffer is full, then constrain the input stimulus to prevent new transfers into the design". Semantically, the verification tool will typically discard any states for which a constraint evaluates to a 0 (i.e., the verification tool may never produce a failing scenario showing a violation of some property of the design, if that scenario does not adhere to all the constraints for all time-steps prior to the failure). In this previous example, it would be illegal for the verification tool to produce a trace of length "i" showing a violation of some property, if that trace illustrated the scenario that the buffer was full and a new transfer was initiated into the design between time 0 and i (inclusive).

Symbolic simulation is a symbolic exploration approach that has been used to exhaustively check designs for a bounded number of steps, starting at the initial states. This method verifies a set of scalar tests with a single symbolic vector. Symbolic inputs (represented as BDDs) are assigned to the inputs and propagated through the circuit to the outputs. This technique has the advantage that large input spaces are covered in parallel with a single symbolic sweep of the circuit. The bottleneck of the approach lies in the explosion of the BDD representations.

SUMMARY OF THE INVENTION

A method for performing verification is proposed. The method comprises receiving a design and building an intermediate binary decision diagram for the design containing one or more nodal binary decision diagrams. In response to a size of the intermediate binary decision diagram exceeding a size threshold, a node of the design is selected for case-splitting. A first case-splitting is performed upon the selected node of the design to generate a primary constraint for setting the selected node to a primary value. A first constraining is performed on one of the one or more nodal binary decision diagrams with the primary constraint to generate a primary final binary decision diagram, a first verification of the design is performed using the primary final binary decision diagram.

BRIEF DESCRIPTION OF THE DRAWINGS

The present invention is described in a preferred embodiment in the following description with reference to the drawings, in which like numbers represent the same or similar elements, as follows:

FIGS. 5a-c show a flow-chart of steps taken to deploy in a Virtual Private Network (VPN) software that is capable of executing the steps shown in FIGS. 2 and 3;

DETAILED DESCRIPTION OF A PREFERRED EMBODIMENT

The present invention provides a method, system, and computer program product to optimize case-splitting and ameliorate the explosion in BDD representations when simulating a design symbolically. The method of the present invention ensures that the sizes of intermediate BDDs do not exceed a specified size limit, ultimately improving the likelihood that the symbolic simulation completes on a design for which it otherwise may not have previously completed under the prior art due to resources (e.g. available memory on the machine) exhaustion. The method of the present invention employs a strategy and heuristic for automated case-splitting, and the overall case-splitting approach improves the likelihood completeness—e.g., the analysis of all cases, as if no case splitting had been performed. The method of the present invention enables significant performance improvements over that possible in the prior art, offering the hope of completing symbolic simulation when prior-art solutions may not have completed due to memory explosion.

The present invention is generally applicable to a sequential design representation (application of this invention to a combinational design follows as a special case of the sequential model).

Figure 1:
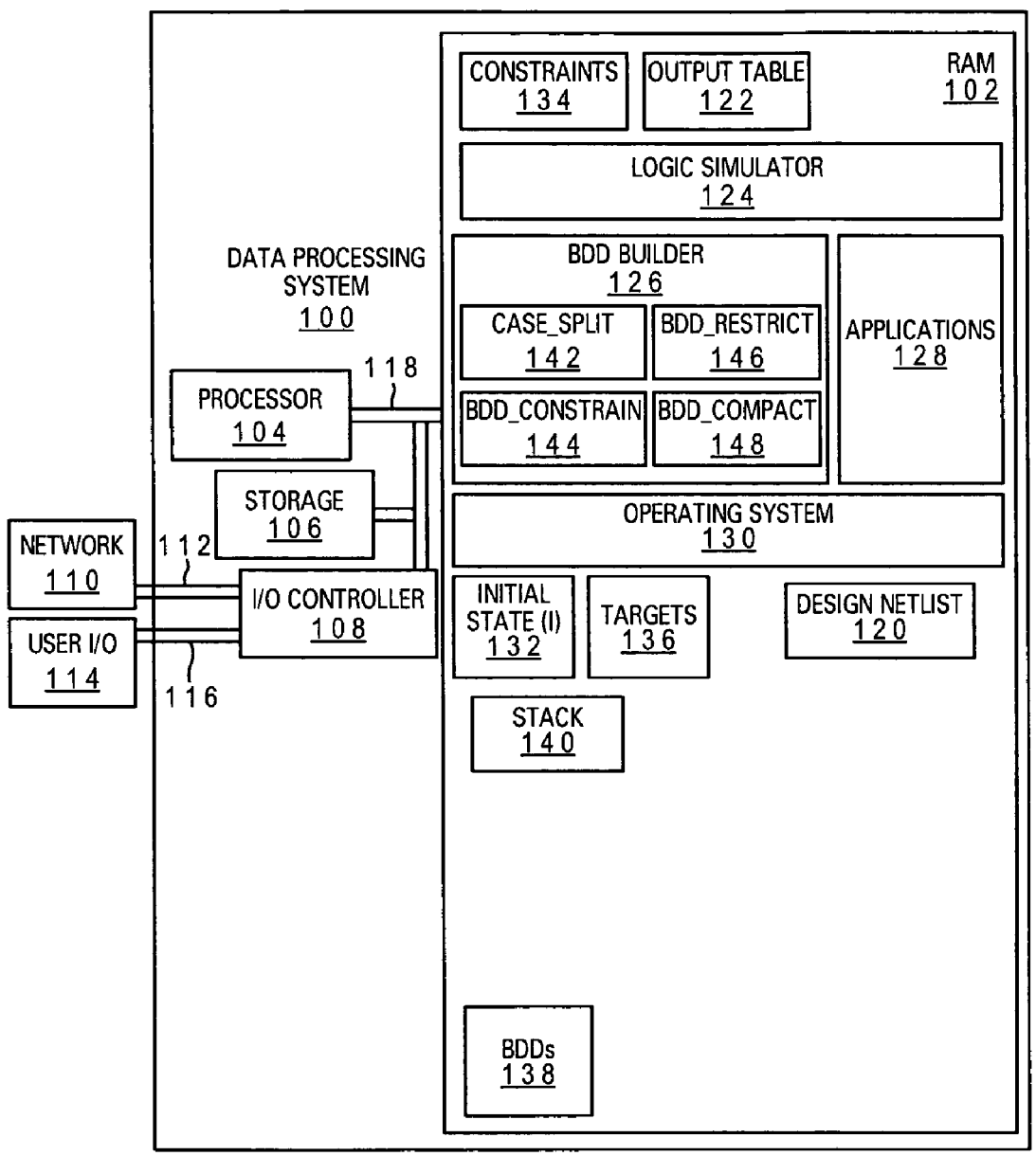
FIG. 1 illustrates a block diagram of a general-purpose data processing system with which the present invention of a method, system and computer program product for optimized automated case splitting via constraints in a symbolic simulation framework may be performed.

With reference now to the figures, and in particular with reference to FIG. 1, a block diagram of a general-purpose data processing system, in accordance with a preferred embodiment of the present invention, is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include a design netlist 120 and an output table 122 for interaction with a logic simulator 124 and a binary decision diagram builder 126. Other applications 128 and logic simulator 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention. Other data structures in RAM 102 include an initial state data structure 132 containing an initial state of design netlist 120, a constraints 134 data structure, binary decision diagrams 138, a stack 140, and a targets 136 data structure, detailing operational characteristics of the simulation run by logic simulator 124.

A netlist graph, such as design netlist 120, is a popular means of compactly representing problems derived from circuit structures in computer-aided design of digital circuits. Such a representation is non-canonical and offers limited ability to analyze the function from the nodes in the graph. A netlist contains a directed graph with vertices representing gates and edges representing interconnections between those gates. The gates have associated functions, such as constants, which are also represented in constraints 134 data structure, primary inputs, primary outputs, combinational logic (e.g., AND gates), and sequential elements (hereafter referred to as registers). Registers have two associated components; their next-state functions and their initial-value functions, which are represented as other gates in the graph. Certain gates in the netlist may be labeled as "primary outputs", "targets", "constraints", etc.

Binary decision diagrams 138 are a popular choice for efficiently applying Boolean reasoning to problems derived from circuit structures, which are frequently represented in netlist graphs. Binary decision diagrams 138 offer a compact and canonical representation of the Boolean function of a graph node, which expedites reasoning regarding a node's function.

Processor 104 executes instructions from programs, often stored in RAM 102, in the course of performing the present invention. In a preferred embodiment of the present invention, processor 104 executes logic simulator 124. Logic simulator 124 performs the creation of binary decision diagrams 138 through the operation of binary decision diagram builder 126 on the circuit specifications contained in design netlist 120, which contains instructions for modeling a simulated item of logical hardware.

In a preferred embodiment, the present invention is applied to a netlist representation where the only combinational gate type is a 2-input AND, and inverters are represented implicitly as edge attributes. Registers have two associated components, their next-state functions, and their initial-value functions. Both are represented as other gates in design netlist 120. Semantically, for a given register, the value appearing at its initial-value gate at time '0' ("initialization" or "reset" time) will be applied as the value of the register itself; the value appearing at its next-state function gate at time "i" will be applied to the register itself at time "i+1". Certain gates are labeled as "targets" and/or "constraints".

Targets 136 represent nodes whose Boolean expressions are of interest and need to be computed. The goal of the verification process is to find a way to drive a '1' on a target node, or to prove that no such assertion of the target is possible. In the former case, a "counterexample trace" showing the sequence of assignments to the inputs in every cycle leading up to the fail event getting triggered is generated and recorded to output table 122.

Logic simulator 124 includes a computer program product, stored in RAM 102 and executed on processor 104, which provides a series of tools for activities such as equivalence checking, property checking, logic synthesis and false-paths analysis. Generally speaking, logic simulator 124 contains rule-based instructions for predicting the behavior of logically modeled items of hardware.

Logic simulator 124 uses the series of rules contained in its own instructions, in conjunction with design netlist 120, to represent the underlying logical problem structurally (as a circuit graph), and uses binary decision diagram builder 126 to construct binary decision diagrams 138, thereby converting the structural representation into a functionally canonical form. In a preferred embodiment, logic simulator 124 is a Cycle-Based Symbolic Simulator (CBSS), which performs a cycle-by-cycle simulation on design netlist 120 symbolically by applying unique random, or non-deterministic, variables to the netlist inputs in every cycle.

At each step the Boolean expressions, represented as BDDs 138, corresponding to each node in design netlist 120 are computed until the expressions for all "sink" nodes (i.e. nodes labeled as primary outputs, targets, constraints and next-state functions of registers) are obtained. At each step of the simulation the Boolean expressions of the target nodes are tested for being non-zero. If so, a counterexample trace leading up to the failure (represented by the assertion of the target node to a '1') is returned. The constraints need to be factored in before this check for the targets being hit can be done. This factoring is typically accomplished by simply ANDing the Boolean expression for the target with the Boolean expression for each of the constraints.

A Cycle-Based Symbolic Simulator (CBSS), such as is contained in logic simulator 124, performs a cycle-by-cycle symbolic simulation on a netlist representation of the design in design netlist 124 symbolically by applying unique random, or non-deterministic, variables to inputs in design netlist 124 at every cycle. Logic simulator 124 essentially performs forward BDD-based bounded symbolic simulation, starting from initial state 132. Logic simulator 124 extends the cycle simulation methodology to symbolic values. Logic simulator 124 applies symbolic functions to the inputs in every cycle and propagates them to the targets 136. At each step the Boolean expressions, represented as binary decision diagrams 138, corresponding to each node in design netlist 120 are computed until the expressions for all "sink" nodes, i.e. nodes labeled as primary outputs, targets 136, constraints 134 and next-state functions of registers, are obtained.

At each step of the simulation the Boolean expressions of the target 136 nodes are tested for being non-zero. If so, a counterexample trace leading up to the failure (represented by the assertion of the target node to a '1') is returned and reported to output table 122. If unsolved targets 136 remain, then the registers are updated with the values, represented as binary decision diagrams 138, of the next-state functions, and the process continues. At every step of the verification process process, there is a potential for a blow-up in memory when computing the binary decision diagrams 138 for any of the sink nodes.

The method of the present invention addresses the risk of memory blow-up when computing intermediate binary decision diagrams 138 in several steps. First, if an intermediate binary decision diagram 138 size exceeds a certain size threshold at a particular time-step, logic simulator 124 selects a binary decision diagram 138 node to case-split on, and the value to be applied to the selected, node(s). Second, upon case-splitting the binary decision diagram 138 sizes drop significantly, and logic simulator 124 then continues with the symbolic analysis using reduced resources relative to that which was possible without the case splitting. Third, logic simulator 124 may then repeat the case-split on any number of nodes at different steps and stages of the symbolic simulation. Fourth, once logic simulator 124 completes the symbolic analysis (i.e. the design has been symbolically simulated for the required number of time-steps), logic simulator 124 "backtracks" to the last case-split (and the time-step in which it was applied) and sets the selected node to the next constant (i.e. if a single node was selected for case-splitting, the present invention set it to the opposite value of what it was set to in the prior analysis), and completes the symbolic analysis for that split. This reversion step is continued until all case-splits are covered, ensuring complete coverage of the search space.

Furthermore, the present invention enables logic simulator 124 to perform case-splitting using global resources, in which case the case-splitting gracefully degrades into under-approximate analysis if the global resource limits are exceeded. In underapproximate analysis, the complete search will not be performed by logic simulator 124 after global resources are exceeded, (i.e. the process will not backtrack to try the other value of the case-split node(s)). Nonetheless, very high coverage will be attained by logic simulator 124 using the process of the present invention through the selection of high-quality case splits.

Lastly, the present invention includes in logic simulator 124 a novel heuristic to select the node(s) to case-split upon which is very effective in managing space complexity of binary decision diagram 138 operations, and efficiently yielding high coverage. Logic simulator 124 performs case-splitting via constraining with constraints 134. Logic simulator 124 selects a binary decision diagram 138 representation of the function of internal node for a given time-step, and splits upon the selected node by forcing the selected node to a selected constant. Logic simulator 124 propagates the effects of the split to the other live binary decision diagrams 138, and thereby dramatically reduces overall resources, by constraining the other binary decision diagrams 138 with respect to this case-split binary decision diagram 138 set to the selected constant. By doing do, in a sense, logic simulator 124 restricts the values at the input variables that lie in the cone-of-influence of the selected node to combinations that cause this internal node to assume the selected constant value. Next, once logic simulator 124 completes the analysis for the first selected constant, logic simulator 124 backtracks to complete the symbolic simulation using the opposite constant for that node, thus ensuring complete coverage.

A special case of this approach arises in logic simulator 124 case-splitting upon a register by selecting one with the largest binary decision diagram 138 representation. In a sense, by case-splitting on internal nodes, logic simulator 124 causes the entire logic in the cone-of-influence of this node in an unfolded design netlist 120 to drop out from any further analysis, and instead be replaced by a constant, and the values enforced on the variables in the support of this node to be propagated to the binary decision diagrams 138 for the other nodes.

A useful feature of logic simulator 124 is that logic simulator 124 selects internal nodes to automatically split upon, with the effect of considering a set of values at the inputs that lie in support of the selected nodes, enabling higher-quality case splits which cover more cases with fewer splits, often yielding exponential speed improvement over traditional methods.

The overall symbolic simulation algorithm used by logic simulator 124 can be represented as the following pseudocode:

---

1. Function symbolic_simulate
2. Begin
3.   cycle_num = 0;
4.   while (cycle_num < (no. of cycles to be simulated) && (unsolved targets remaining)) do
5.     if(cycle_num == 0) { Build BDDs for the initial values and Initialize the design by applying the initial value functions to the registers}
6.     else         { Propagate BDDs for the next-state function nodes from cycle_num−1 to the register nodes to prepare for the current cycle }
7.     Create new BDD variables for each of the inputs for the current cycle
8.     Build BDDs for the constraints
9.     Build BDDs for the targets in the presence of constraints
10.    Constrain the target BDDs and check for targets hit
11.    Build BDDs for the next-functions in the presence of the constraints
12.    cycle_num++
13. endwhile
14. endfunction.

---

Any of steps 5, 8, 9 and 11 of the overall symbolic simulation algorithm discussed above are subject to failure due to resource exhaustion, as described above. Therefore, logic simulator 124 performs steps 5, 8, 9 and 11 of the overall symbolic simulation algorithm discussed above, such that if a specified threshold (specified either by the user or automatically determined by logic simulator 124 based on whether the available allotment of resources—e.g., memory available on the machine) is exceeded during binary decision diagram 138 construction, logic simulator 124 introduces a case-split.

The case-split restricts the values of the selected variable and/or node causing a drop, often a dramatic drop, in the number of live binary decision diagram 138 nodes. Logic simulator 124 then continues the above-described algorithm until completion (i.e., the number of steps to be checked are completed or all targets 136 are solved), or until a binary decision diagram 138 again exceeds resources, in which case a next case-split is performed. The case-splits are stored on stack 140, and once all steps have been checked, logic simulator 124 "backtracks" to the last case-split and applies the next value for the node/variable that the present inventionre case-split upon (the next value selection is described in more detail later). Logic simulator 124 continues this process until stack 140 becomes empty, increasing the likelihood of completeness of the entire process in that all possible values for all variables will have been considered. Note that the backtracking involves logic simulator 124 going back to a previous time-step and then continuing the temporal computation from there.

Note also that stack 140 dynamically grows and shrinks. For example, when logic simulator 124 backtracks to the first case-split and assigns to the case-split node or variable the next value, the value previously disallowed. Logic simulator 124 may apply another case-split while the current case for the first case-split is being computed. This new case-split is then entered on stack 140. Intuitively, case-split evaluations by logic simulator 124 can be visualized as a tree in which each node of the tree represents a case-split of a node at a certain cycle, and the children of the tree node represent evaluations of the design caused by setting the case-split node to the selected constant. The tree node corresponding to a case-split will have two children, one each for the '0' and '1' value applied to that case-split node. A stack 140 entry consists of all live binary decision diagrams 138 just before the case-split All live binary decision diagrams 138 are preserved in a snapshot at the time of the case-split in order to be able to recreate the state once the process backtracks to this case-split and processes the next branch.

While the present invention is described in the context of selecting a single node to case-split upon at any given point in time, it is equally applicable and easily extended to the situation where multiple nodes may be selected to case-split upon at every step. Generally, in a tree like representation or visualization of the case-splits, the number of children of any tree node should equal the total number of possible value assignments to the case-split nodes to ensure complete coverage. For completeness, the evaluations implied by all children nodes of a tree node cover all values to the function being case split upon (i.e., the OR of (function ==child-value) across all child nodes is a tautology).

The building function used by logic simulator 124 in BDD builder 126 when constructing binary decision diagrams 138 in steps 5, 8, 9 and 11 (above) can be represented as pseudo-code as follows:

1. Function build_node_bdd(Edge edge)
2. Begin
3.   Node node = source(edge);      //see the gate which sources the edge
4.   bool ivt = is_inverted(edge);   //see if the edge was inverted
5. If(bdd_already_built(node)) bdd = get_node_bdd(node); // check if already built
6. else {
7.   BDD left = build_node_bdd(get_left_child(node));
8.   BDD right = build_node_bdd(get_right_child(node));
9.   bdd = bdd_and(left, right);

-continued 10. if(not_valid(bdd)) {    // resources exceeded
       while(not_valid(bdd)) {
         case_split( ); // performs the case-split - also
         choses the node(s)/variable(s) to split upon
         bdd = bdd_and(left, right);
       }
11. bdd = constrain_bdd(bdd);
12. }
13. return ivt? bdd_not(bdd): bdd;
14. endfunction A case_split function 142 chooses the next node(s) to split upon. It subsequently preserves all live binary decision diagrams 138, to be used when backtracking to apply the other value of the case-split node(s), as explained above, and stores them on stack 140. Case_split function 142 also records the cycle number and the phase or stage of the symbolic simulation when the case-split occurred (such as "building target BDDs" to "building next-state function BDDs").

The selection of case split nodes is done by case_split function 142 as follows. We select the node with the largest binary decision diagram 138 representation, and force it to a constant—a '0' or a '1'. Essentially, the resulting binary decision diagrams 138 will be treated as a constraint 134 as set to the selected constant, and used to constrain all live binary decision diagram 138 nodes. The constraint 134 defines a care-set, and uses a binary decision diagrams 138 operation from the set of bdd_constrain 144, bdd_restrict 146 or bdd_compact 148 to minimize the other binary decision diagrams 138 with respect to the defined care-set (i.e. the effect of setting the internal node to a constant is propagated to the other binary decision diagrams 138 by constraining all those using this binary decision diagram 138 as set to the selected constant). A constraint is effectively a constraint 134 on the variables on the support of the binary decision diagrams 138, (i.e. it defines a set of values at the inputs of the constraint which is then propagated to the other live binary decision diagrams 138).

The binary decision diagram 138 at the selected node is reduced to a single constant node. In a sense this reduction is equivalent to removing the logic in the cone-of-influence of this node up to the current time-step (i.e. logic in the cone-of-influence of this node in an unfolded version of design netlist 120). The constant to set the node to is selected by trying out the reduction on the binary decision diagram 138 nodes obtained by setting it to both constants '0' and '1', and selecting the value that causes the maximum reduction in the number of binary decision diagram 138 nodes. As a variation to this reduction, logic simulator 124 can also compute the binary decision diagram 138 size reduction obtained by case-splitting on multiple internal nodes for which binary decision diagrams 138 have been computed, and for each of the two values '0' and '1', and splitting upon the node that results in the largest node reduction.

As an optimization, instead of creating a snapshot of all the live binary decision diagrams 138, logic simulator 124 can create a snapshot of only binary decision diagrams 138 computed for the other value of the selected node. These binary decision diagrams 138 are already available when choosing the value to set the variable to, as described above. Once the process backtracks to this case-split the logic simulator 124 for the other value of the node are already available on the stack and are used. For example, if logic simulator 124 first chose to set the node to a '1' logic simulator 124 creates a snapshot of the binary decision diagrams 138 for the nodes that are obtained by constraining their binary decision diagrams 138 before the case-split with the case-split node set to '0' for use upon backtracking. As another optimization, the stored binary decision diagrams 138 may be stored in off-line memory, such as in storage 106, so that they do not impact the optimality and performance of the processing of the current case. When backtracking to the last case split, the stored binary decision diagrams 138 may be restored within the active binary decision diagram 138 handled by BDD builder 126 and processing continues.

Logic simulator 124 can incorporate the above-discussed refinements through a modified cycle-based symbolic simulation algorithm with the case-splits as demonstrated in the following pseudocode:

```
1.  Function symbolic_simulate
2.  Begin
3.  cycle_num = 0;
4.  while (cycle_num <= (no. of cycles to be simulated) && (unsolved
targets remaining) && !(global_resources_exceeded) do
5.  if(cycle_num = = 0) { Build BDDs for the initial values and
Initialize the design by applying the initial value functions to the regis-
ters}
6.  else {         Propagate BDDs for the next-state function nodes from
cycle_num-1 to the register nodes to prepare for the current cycle }
7.  Create new BDD variables for each of the inputs for the current cycle
8.  Build BDDs for the constraints
9.  Build BDDs for the targets in the presence of constraints
10. Constrain target BDDs and check for targets hit
11. if(cycle_num = = (no. of cycles to be simulated)) {
12. if(cases remain, i.e. cases stack is not empty) {
13.    cycle_num = cycle num of the last case-split
14.    Restore BDDs for all nodes to their value for the other value of the
case split node, and set the value of the node to the other value
15.    Remove this case from the cases stack
16.    Go to the phase (such as building target BDDs or next-state
function BDDs) in which the case-split occurred
        }
      }
    }
17.   Build BDDs for the next-state functions in the presence of the
constraints
18. cycle_num++
19. endwhile
20. end function
```

Note that logic simulator 124 supports termination upon exceeding of global resources, in which case the analysis by logic simulator 124 gracefully degrades into underapproximate analysis by not completing analysis for the values of the case-split nodes that have not been attempted yet. This termination upon exceeding of global resources is akin to performing a wide breadth-first simulation of the design with a large number of variables assuming truly non-deterministic symbolic valuations, and some variables (namely the variables in the support of the case-split nodes) being assigned a constrained set of values. Note that a variable refers here to a single copy of an input to the design at a certain cycle and does not imply that the inputs are fixed to a constrained values in every cycle. Hence, this approach performs a simulation of a very large number of test-vectors in parallel resulting in visiting, a large number of states. Even in the case of early incomplete termination due to global resources being exceeded, the high-quality case splits selected by our automated framework very high coverage.

Figure 2:
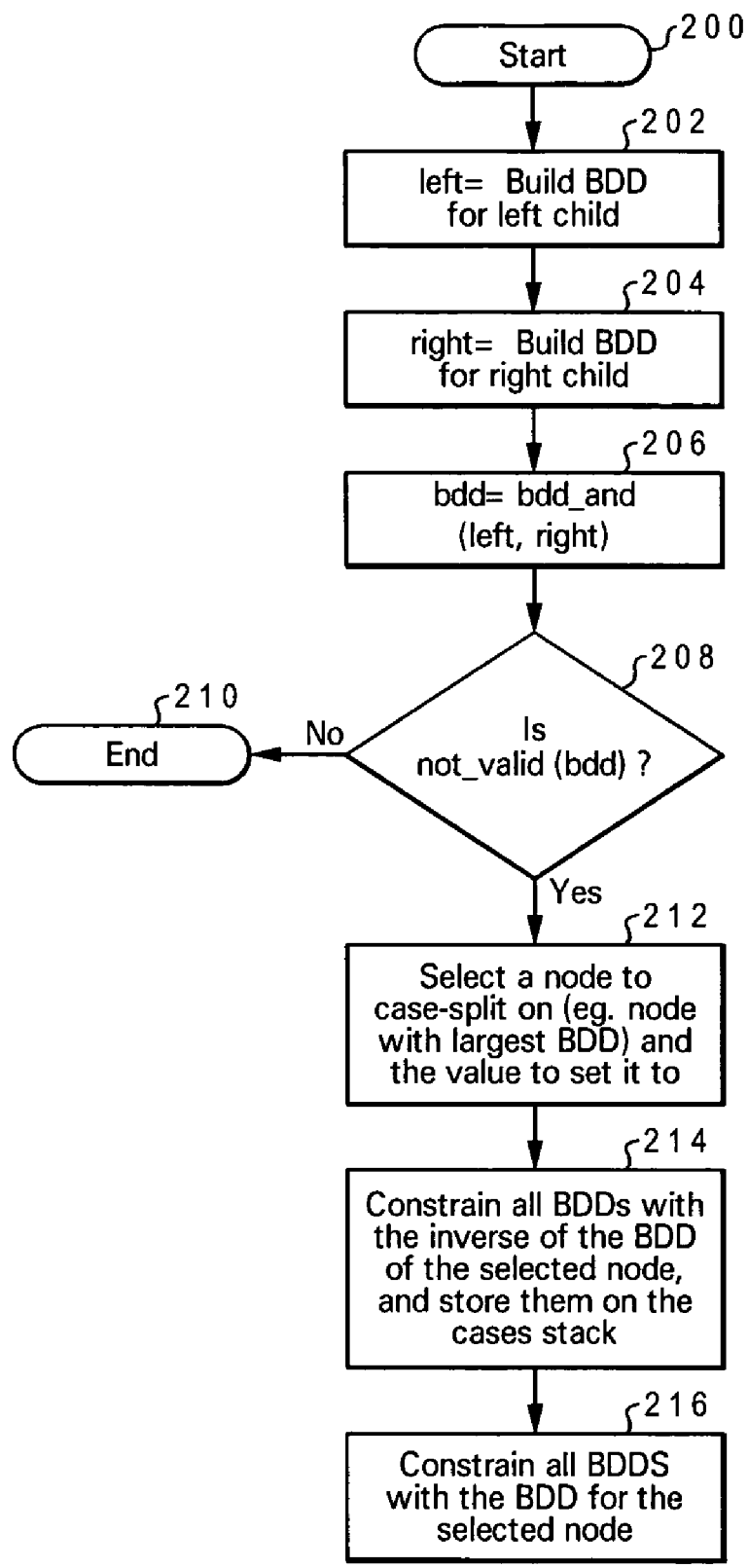
FIG. 2 is a flow diagram of a process for optimized automated case splitting via constraints in a symbolic simulation framework, in accordance with the preferred embodiment of the present invention.

Turning now to FIG. 2, a high level logical flowchart of a process for optimized automated case splitting via constraints in a symbolic simulation framework is depicted. The process starts at step 200. The process then proceeds to step 202, which depicts binary decision diagram builder 126 building a binary decision diagram 138 for a left child node. The process next moves to step 204. At step 204, binary decision diagram builder 126 builds a binary decision diagram 138 for a right child node. The process next proceeds to step 206, which depicts binary decision diagram builder 126 creating an aggregate binary decision diagram 138 composed of the combination of the binary decision diagram 138 for the left child node from step 202 and the binary decision diagram 138 for the right child node from step 204. The process next moves to step 208.

At step 208, logic simulator 124 determines whether the function not_valid(BDD) is active for the aggregate binary decision diagram 138 constructed in step 206. If logic simulator 124 determines that the function not_valid(BDD) is active for the aggregate binary decision diagram 138 created in step 206, then the process ends at step 210.

If, at step 208 logic simulator 124 determines that the function not_valid(BDD) is valid for the aggregate binary decision diagram 138 constructed in step 206, then the process next moves to step 212, which depicts logic simulator 124 selecting a node to case split on. Such a node might be the node with the largest available binary decision diagram 138. At step 212, binary decision diagram builder 126 also selects the value to which to set the node.

The process then moves to step 214. At step 214 logic simulator 124 constraints all binary decision diagrams with the inverse of the binary decision diagram 138 of the selected node and stores them on the stack 140. The process then moves to step 216, which depicts logic simulator 124 constraining all binary decision diagrams 138 with the binary decision diagram 138 for the selected node. The process then returns to step 202, which is described above.

Figure 3:
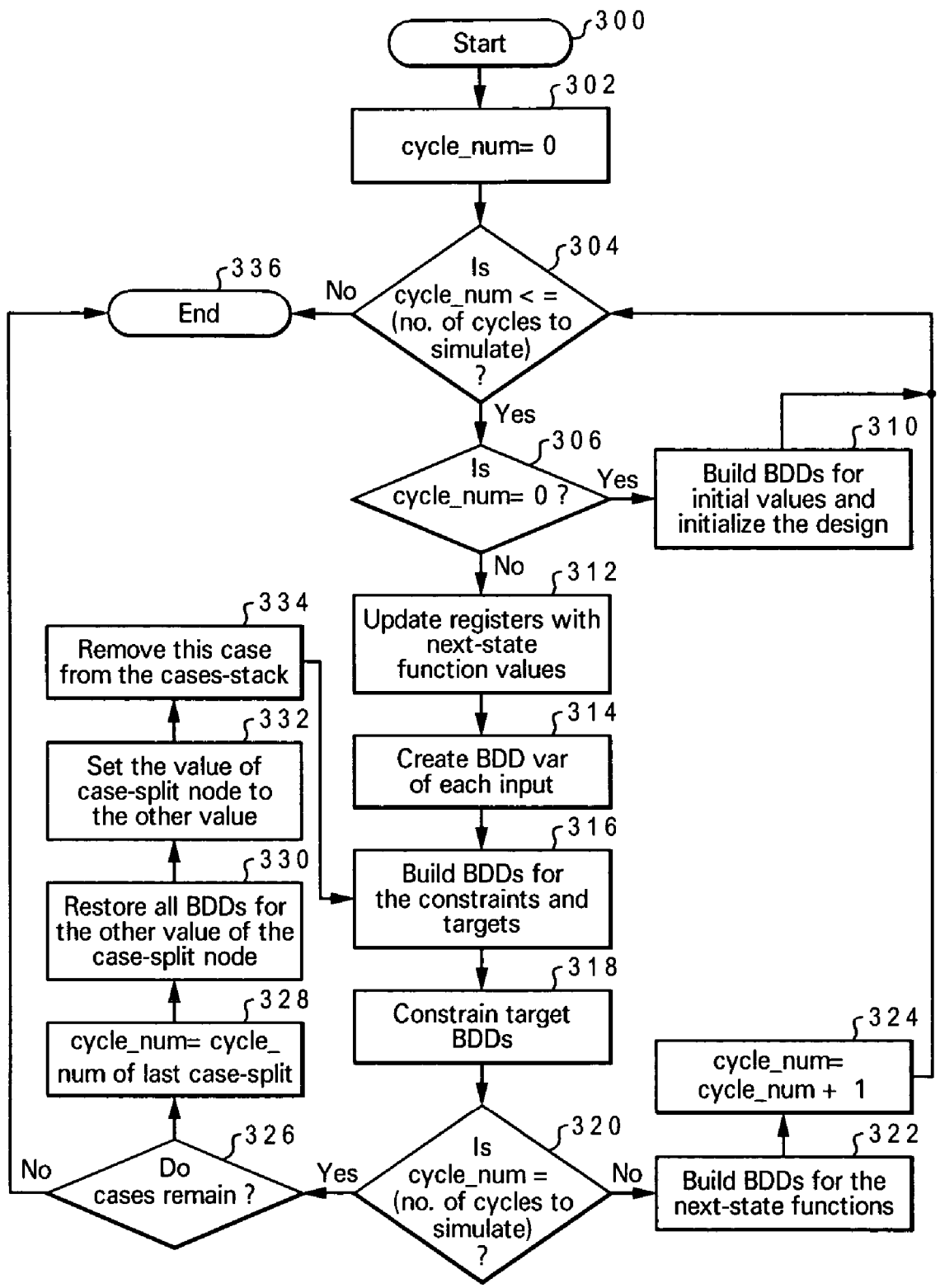
FIG. 3 is a high level logical flow chart of a process for performing symbolic simulation in a preferred embodiment of the present invention.

Turning now to FIG. 3, a high level logical flow chart of a process for performing symbolic simulation in a preferred embodiment of the present invention is depicted. The process starts at step 300. The process next moves to step 302, which depicts logical simulator 124 setting the variable cycle_num equal to zero. The process then proceeds to step 304. At step 304, logic simulator 124 determines whether cycle_num is less than or equal to the number of cycles to simulate. If logic simulator 124 determines that cycle_num is not less than or equal to the number of cycles to simulate then the process ends at step 336.

If logic simulator 124 determines that cycle_num is less than or equal to the number of cycles to simulate, then the process next moves to step 306, which depicts logic simulator 124 determining whether cycle_num is equal to zero. If cycle_num is equal to zero, then the process then proceeds to step 310. At step 310, binary decision diagram builder 126 builds binary decision diagrams 138 for initial values and initializes the design contained in design netlist 120. The process then returns to step 304.

Returning to step 306, if logic simulator 124 determines that cycle_num does not equal zero, then the process next moves to step 312. At step 312 logic simulator 124 updates registers with next state function values. The process then proceeds to step 314, which depicts logic simulator 124 creating a binary decision diagram 138 variable of each input. The process then proceeds to step 316. At step 316, binary decision diagram builder 126 builds binary decision diagrams 138 for constraints 134 and targets 136. The process then moves to step 318, which depicts binary decision diagram builder 126 constraining binary decision diagrams 138 representing targets 136. The process next moves to step 320.

At step 320, logic simulator 124 determines whether cycle_num equals the number of cycles to simulate. If cycle_num does not equal the number of cycles to simulate then the process next moves to step 322. At step 322, binary decision diagram builder 126 builds binary decision diagrams 138 for the next state functions. The process then proceeds to step 324, which depicts logic simulator 124 incrementing cycle_num. The process then returns to step 304.

Returning to step 320, if logic simulator 124 determines that cycle_num is equal to the number of cycles to simulate, then the process moves to step 326, which depicts logic simulator 124 determining if any cases remain. If logic simulator 124 determines that no cases remain, then the process ends at step 336. If logic simulator 124 determines that cases remain, then the process next moves to step 328. At step 328, logic simulator 124 sets cycle_num equal to the value of cycle_num at the last case split. The process then moves to step 330.

At step 330 binary decision diagram builder 126 restores all binary decision diagrams 138 for a previous value of the case split node. The process then moves to step 332, which depicts binary decision diagram builder 126 setting the value of the case split node to the other value. The process then moves to step 334. At step 334 binary decision diagram builder 126 removes these cases from the stack 140. The process then returns to step 316.

Accordingly, the present invention may suitably be embodied as a computer program product for use with a computer system. Such an implementation may comprise a series of computer readable instructions either fixed on a tangible medium, such as a computer readable medium, for example, diskette, CD-ROM, ROM, or hard disk, or transmittable to a computer system, via a modem or other interface device, over either a tangible medium, including but not limited to optical or analog communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, preloaded with a computer system, for example, on a system RON or fixed disk, or distributed from a server or electronic bulletin board over a network, for example, the Internet or World Wide Web.

Software Deployment

Figure 4A:
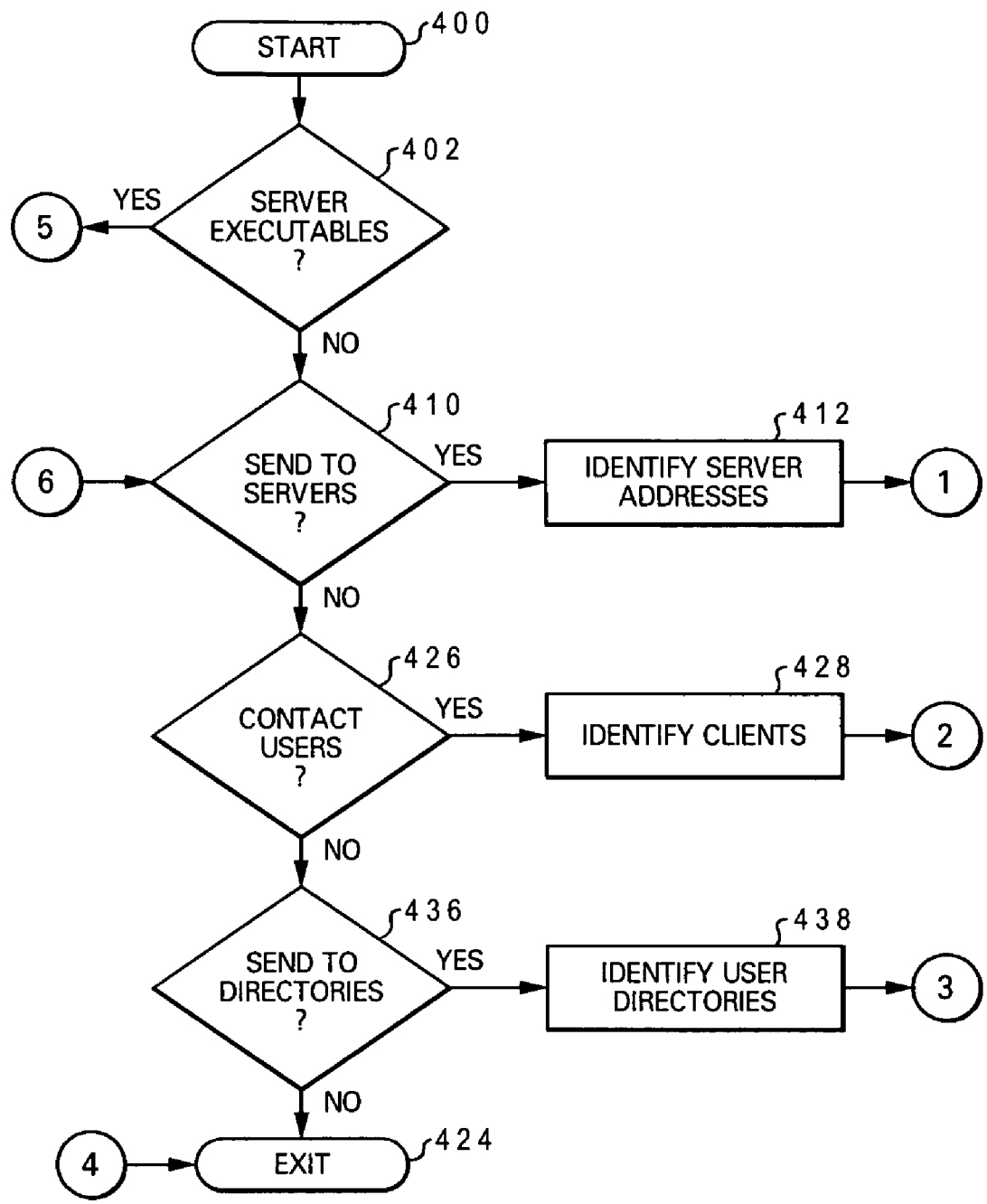
FIGS. 4a-b show a flow-chart of steps taken to deploy software capable of executing the steps shown in FIGS. 2 and 3.
Figure 4B:
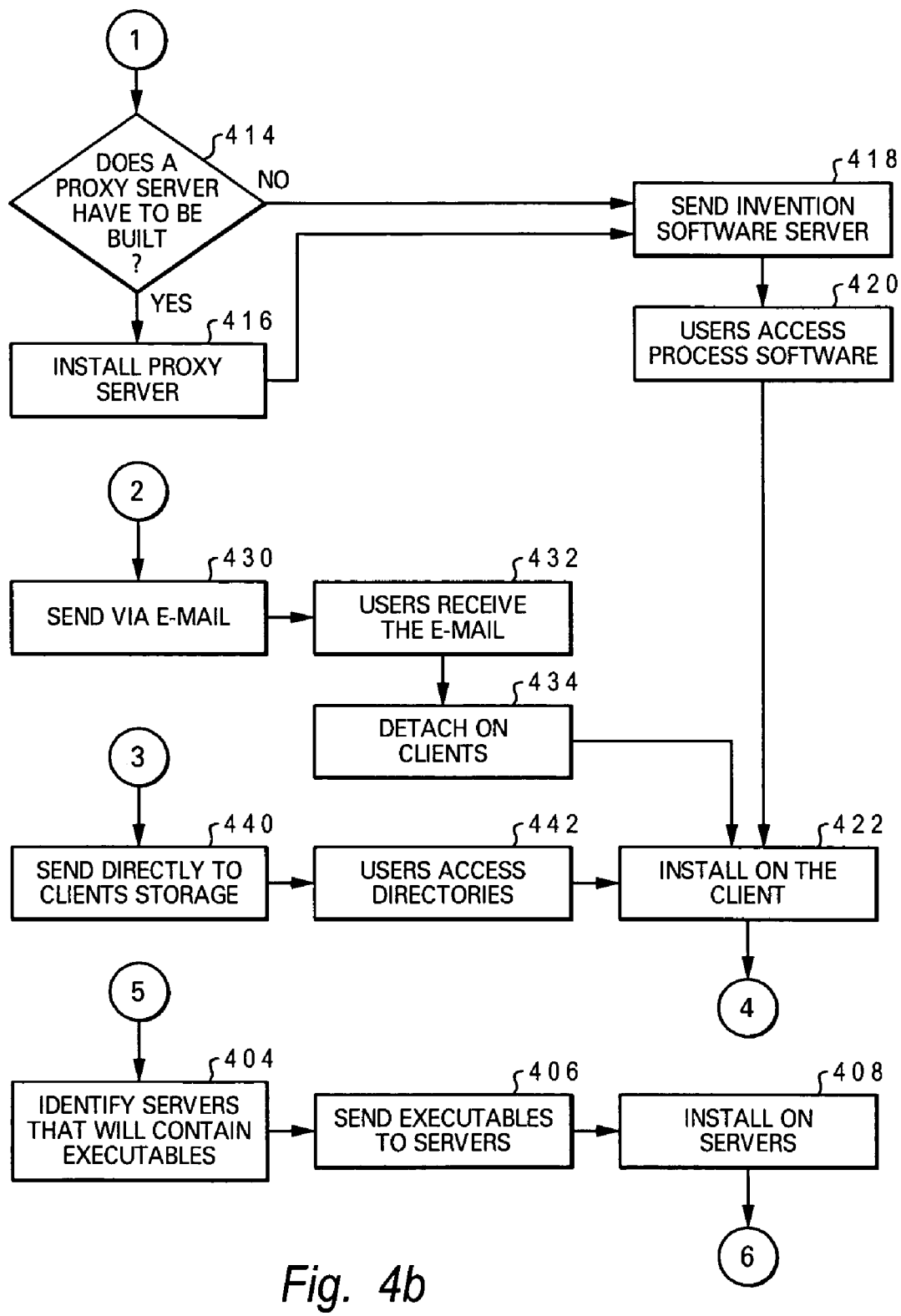

Thus, the method described herein, and in particular as shown in FIGS. 2 and 3, can be deployed as a process software. Referring now to FIG. 4, step 400 begins the deployment of the process software. The first thing is to determine if there are any programs that will reside on a server or servers when the process software is executed (query block 402). If this is the case, then the servers that will contain the executables are identified (block 404). The process software for the server or servers is transferred directly to the servers' storage via File Transfer Protocol (FTP) or some other protocol or by copying though the use of a shared file system (block 406). The process software is then installed on the servers (block 408).

Next, a determination is made on whether the process software is be deployed by having users access the process software on a server or servers (query block 410). If the users are to access the process software on servers, then the server addresses that will store the process software are identified (block 412).

A determination is made if a proxy server is to be built (query block 414) to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed (block 416). The process software is sent to the servers either via a protocol such as FTP or it is copied directly from the source files to the server files via file sharing (block 418). Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems (block 420). Another embodiment is to have the servers automatically copy the process software to each client and then run the installation program for the process software at each client computer. The user executes the program that installs the process software on his client computer (block 422) then exits the process (terminator block 424).

In query step 426, a determination is made whether the process software is to be deployed by sending the process software to users via e-mail. The set of users where the process software will be deployed are identified together with the addresses of the user client computers (block 428). The process software is sent via e-mail to each of the users' client computers (block 430). The users then receive the e-mail (block 432) and then detach the process software from the e-mail to a directory on their client computers (block 434). The user executes the program that installs the process software on his client computer (block 422) then exits the process (terminator block 424).

Lastly a determination is made on whether to the process software will be sent directly to user directories on their client computers (query block 436). If so, the user directories are identified (block 438). The process software is transferred directly to the user's client computer directory (block 440). This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software (block 442). The user executes the program that installs the process software on his client computer (block 422) and then exits the process (terminator block 424).

VPN Deployment

The present software can be deployed to third parties as part of a service wherein a third party VPN service is offered as a secure deployment vehicle or wherein a VPN is build on-demand as required for a specific deployment.

A virtual private network (VPN) is any combination of technologies that can be used to secure a connection through an otherwise unsecured or untrusted network. VPNs improve security and reduce operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee. Access to the software via a VPN can be provided as a service by specifically constructing the VPN for purposes of delivery or execution of the process software (i.e. the software resides elsewhere) wherein the lifetime of the VPN is limited to a given period of time or a given number of deployments based on an amount paid.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-bee number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a companies multiple fixed sites over a public network such as the Internet.

The process software is transported over the VPN via tunneling which is the process the of placing an entire packet within another packet and sending it over a network. The protocol of the outer packet is understood by the network and both points, called runnel interfaces, where the packet enters and exits the network.

Figure 5A:
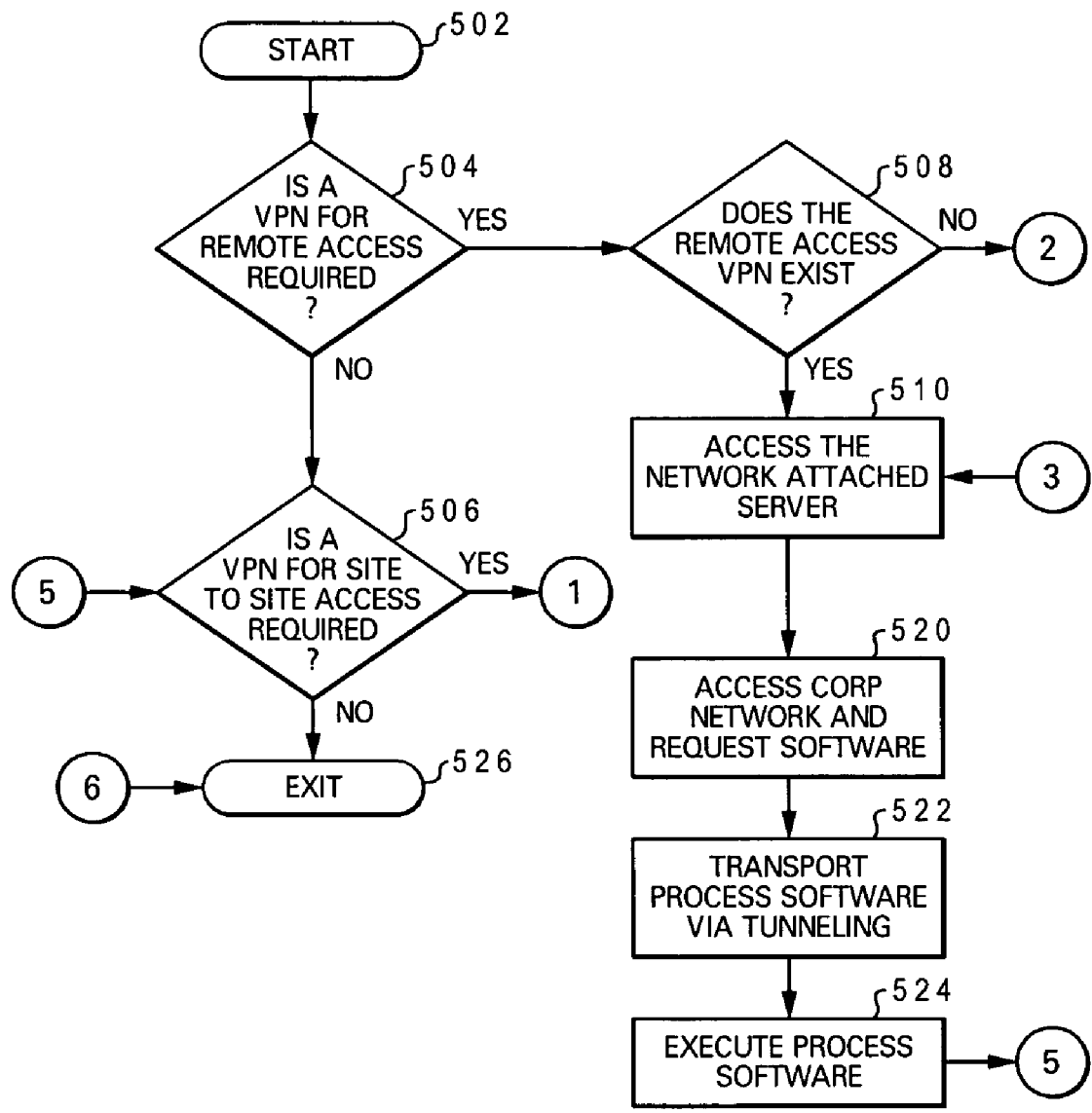

The process for such VPN deployment is described in FIG. 5. Initiator block 502 begins the Virtual Private Network (VPN) process. A determination is made to see if a VPN for remote access is required (query block 504). If it is not required, then proceed to (query block 506). If it is required, then determine if the remote access VPN exists (query block 508).

If a VPN does exist, then proceed to block 510. Otherwise identify a third party provider that will provide the secure, encrypted connections between the company's private network and the company's remote users (block 512). The company's remote users are identified (block 514). The third party provider then sets up a network access server (NAS) (block 516) that allows the remote users to dial a toll free number or attach directly via a broadband modem to access, download and install the desktop client software for the remote-access VPN (block 518).

After the remote access VPN has been built or if it been previously installed, the remote users can access the process software by dialing into the NAS or attaching directly via a cable or DSL modem into the NAS (block 510). This allows entry into the corporate network where the process software is accessed (block 520). The process software is transported to the remote user's desktop over the network via tunneling. That is the process software is divided into packets and each packet including the data and protocol is placed within another packet (block 522). When the process software arrives at the remote user's desk-top, it is removed from the packets, reconstituted and then is executed on the remote users desk-top (block 524).

A determination is then made to see if a VPN for site to site access is required (query block 506). If it is not required, then proceed to exit the process (terminator block 526). Otherwise, determine if the site to site VPN exists (query block 528). If it does exist, then proceed to block 530. Otherwise, install the dedicated equipment required to establish a site to site VPN (block 532). Then build the large scale encryption into the VPN (block 534).

After the site to site VPN has been built or if it had been previously established, the users access the process software via the VPN (block 530). The process software is transported to the site users over the network via tunneling (block 532). That is the process software is divided into packets and each packet including the data and protocol is placed within another packet (block 534). When the process software arrives at the remote user's desktop, it is removed from the packets, reconstituted and is executed on the site users desk-top (block 536). The process then ends at terminator block 526.

Software Integration

The process software which consists code for implementing the process described herein may be integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 6A:
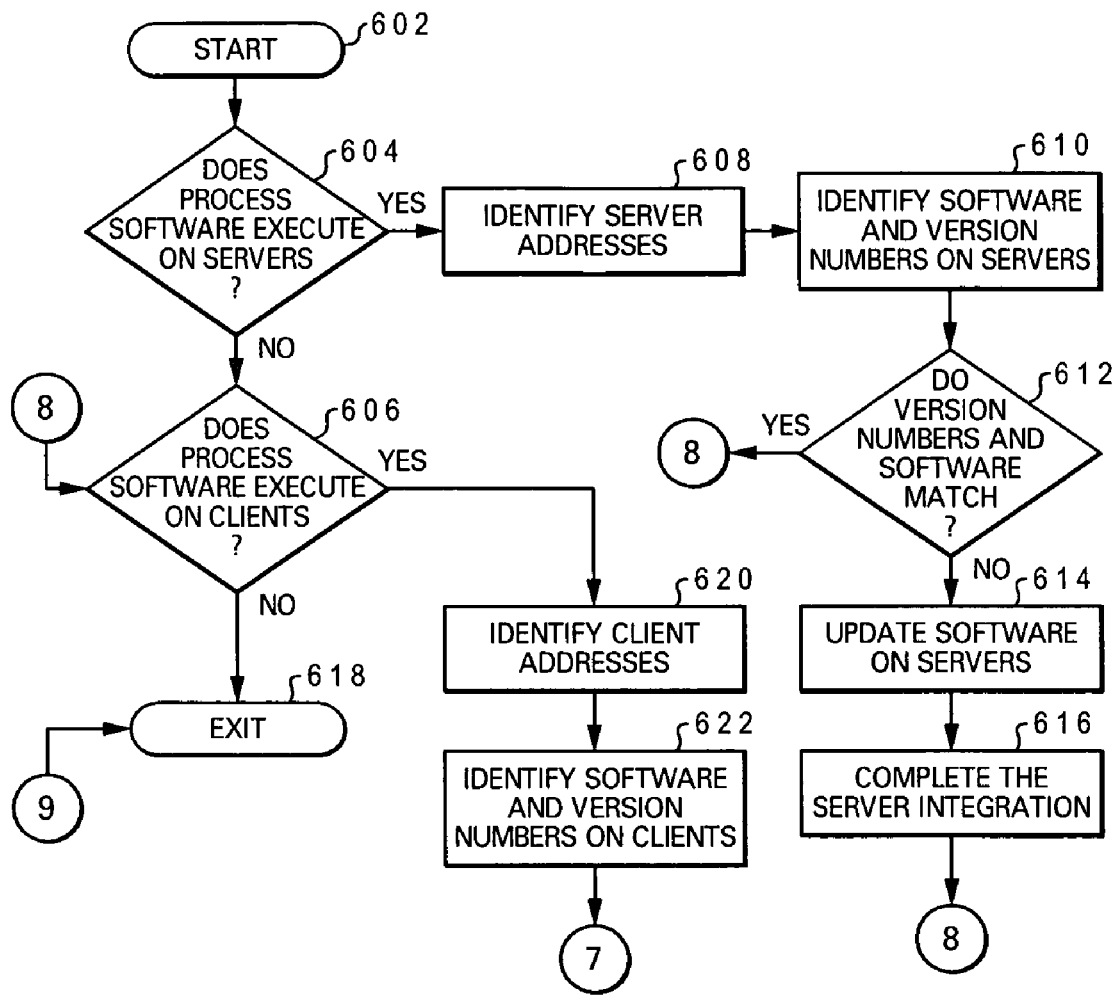
FIGS. 6a-b show a flow-chart showing steps taken to integrate into an computer system software that is capable of executing the steps shown in FIGS. 2 and 3.
Figure 6B:
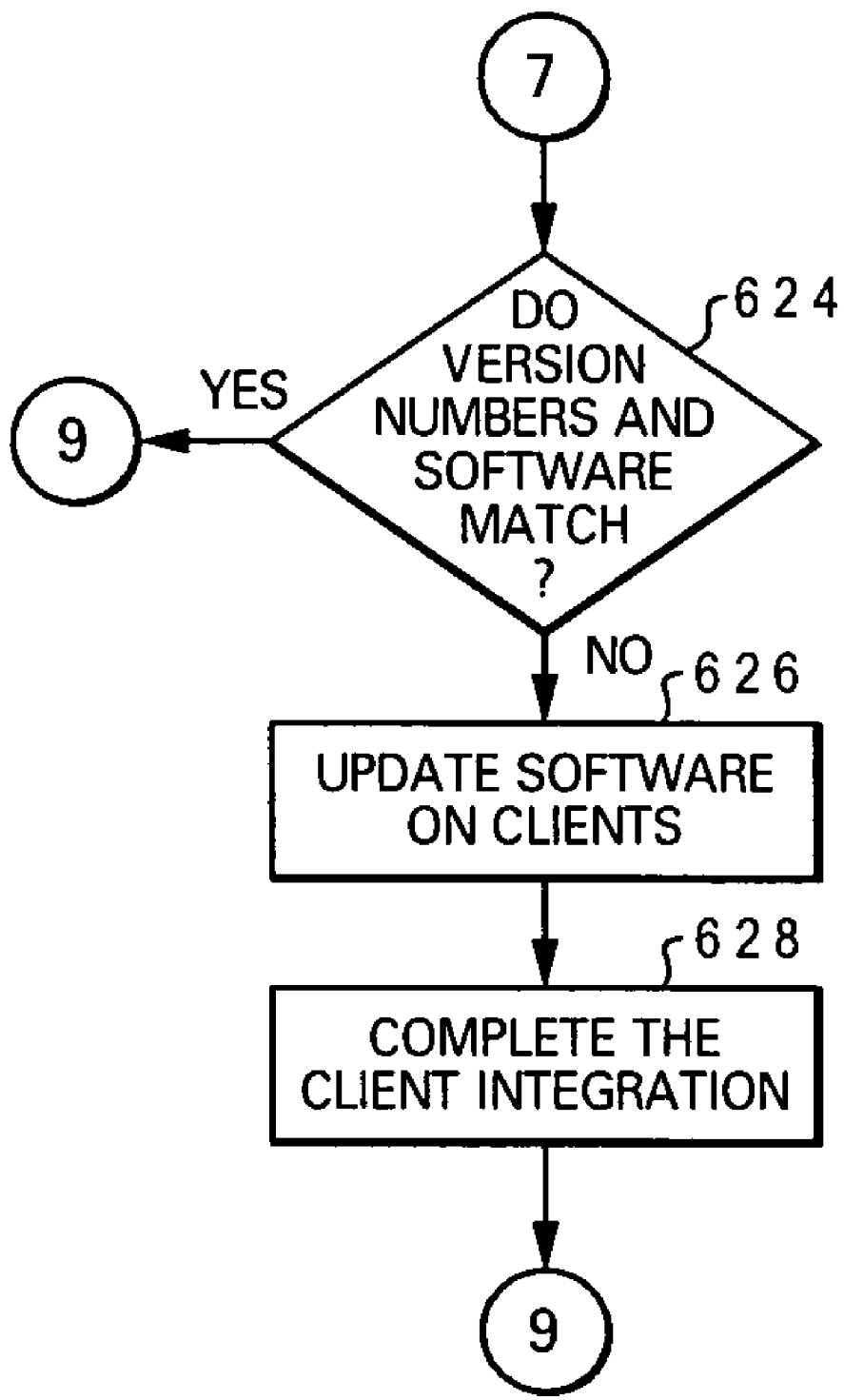

For a high-level description of this process, reference is now made to FIG. 6. Initiator block 602 begins the integration of the process software. The first tiling is to determine if there are any process software programs that will execute on a server or servers (block 604). If this is not the case, then integration proceeds to query block 606. If this is the case, then the server addresses are identified (block 608). The servers are checked to see if they contain software that includes the operating system (OS), applications, and network operating systems (NOS), together with their version numbers, which have been tested with the process software (block 610). The servers are also checked to determine if there is any missing software that is required by the process software in block 610.

A determination is made if the version numbers match the version numbers of OS, applications and NOS that have been tested with the process software (block 612). If all of the versions match and there is no missing required software the integration continues in query block 606.

If one or more of the version numbers do not match, then the unmatched versions are updated on the server or servers with the correct versions (block 614). Additionally, if there is missing required software, then it is updated on the server or servers in the step shown in block 614. The server integration is completed by installing the process software (block 616).

The step shown in query block 606, which follows either the steps shown in block 604, 612 or 616 determines if there are any programs of the process software that will execute on the clients. If no process software programs execute on the clients the integration proceeds to terminator block 618 and exits. If this not the case, then the client addresses are identified as shown in block 620.

The clients are checked to see if they contain software that includes the operating system (OS), applications, and network operating systems (NOS), together with their version numbers, which have been tested with the process software (block 622). The clients are also checked to determine if there is any missing software that is required by the process software in the step described by block 622.

A determination is made is the version numbers match the version numbers of OS, applications and NOS that have been tested with the process software (query block 624). If all of the versions match and there is no missing required software, then the integration proceeds to terminator block 618 and exits.

If one or more of the version numbers do not match, then the unmatched versions are updated on the clients with the correct versions (block 626). In addition, if there is missing required software then it is updated on the clients (also block 626). The client integration is completed by installing the process software on the clients (block 628). The integration proceeds to terminator block 618 and exits.

On Demand

The process software is shared, simultaneously serving multiple customers in a flexible, automated fashion. It is standardized, requiring little customization and it is scalable, providing capacity on demand in a pay-as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 7A:
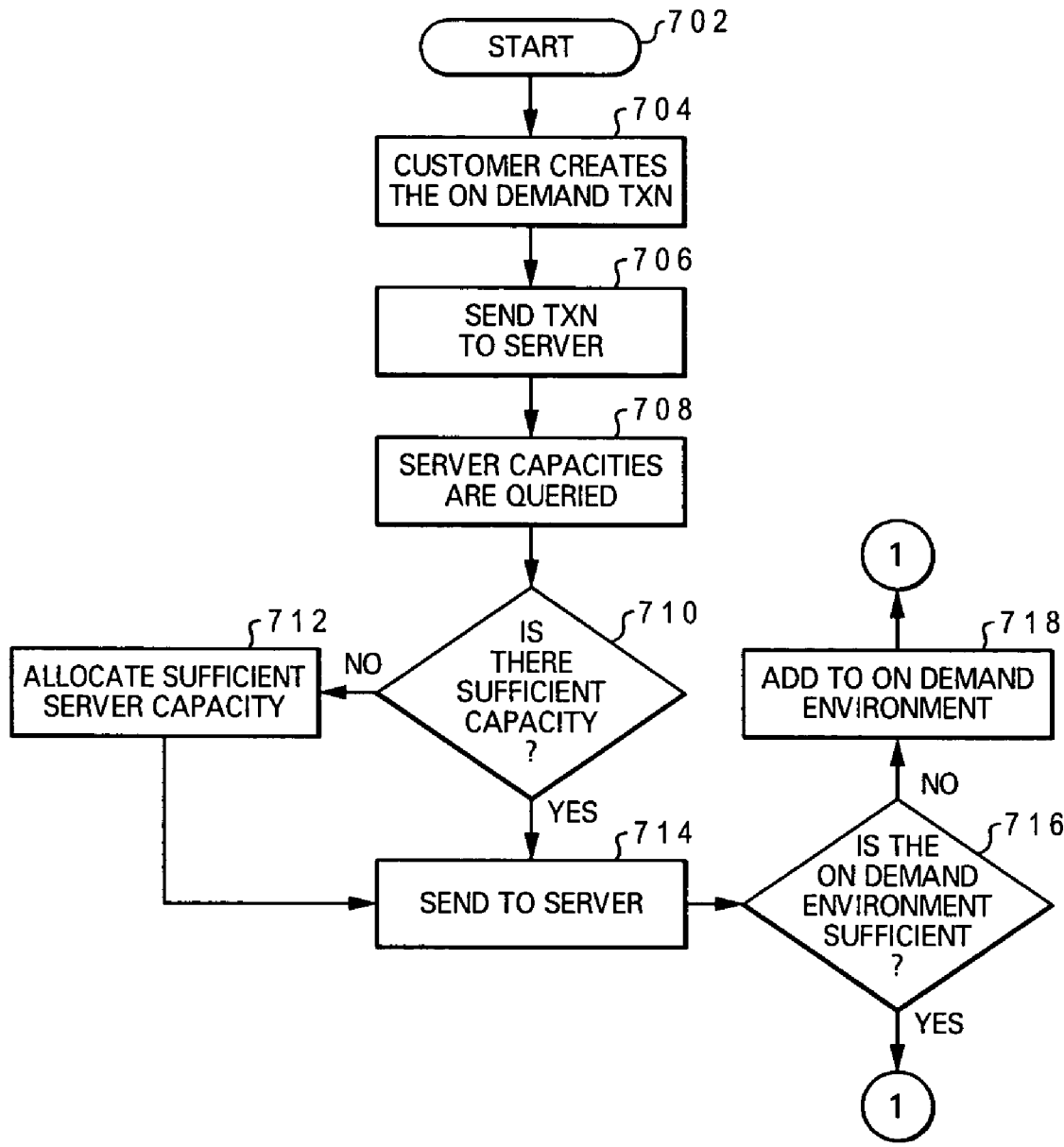
FIGS. 7a-b show a flow-chart showing steps taken to execute the steps shown in FIGS. 2 and 3 using an on-demand service provider.
Figure 7B:
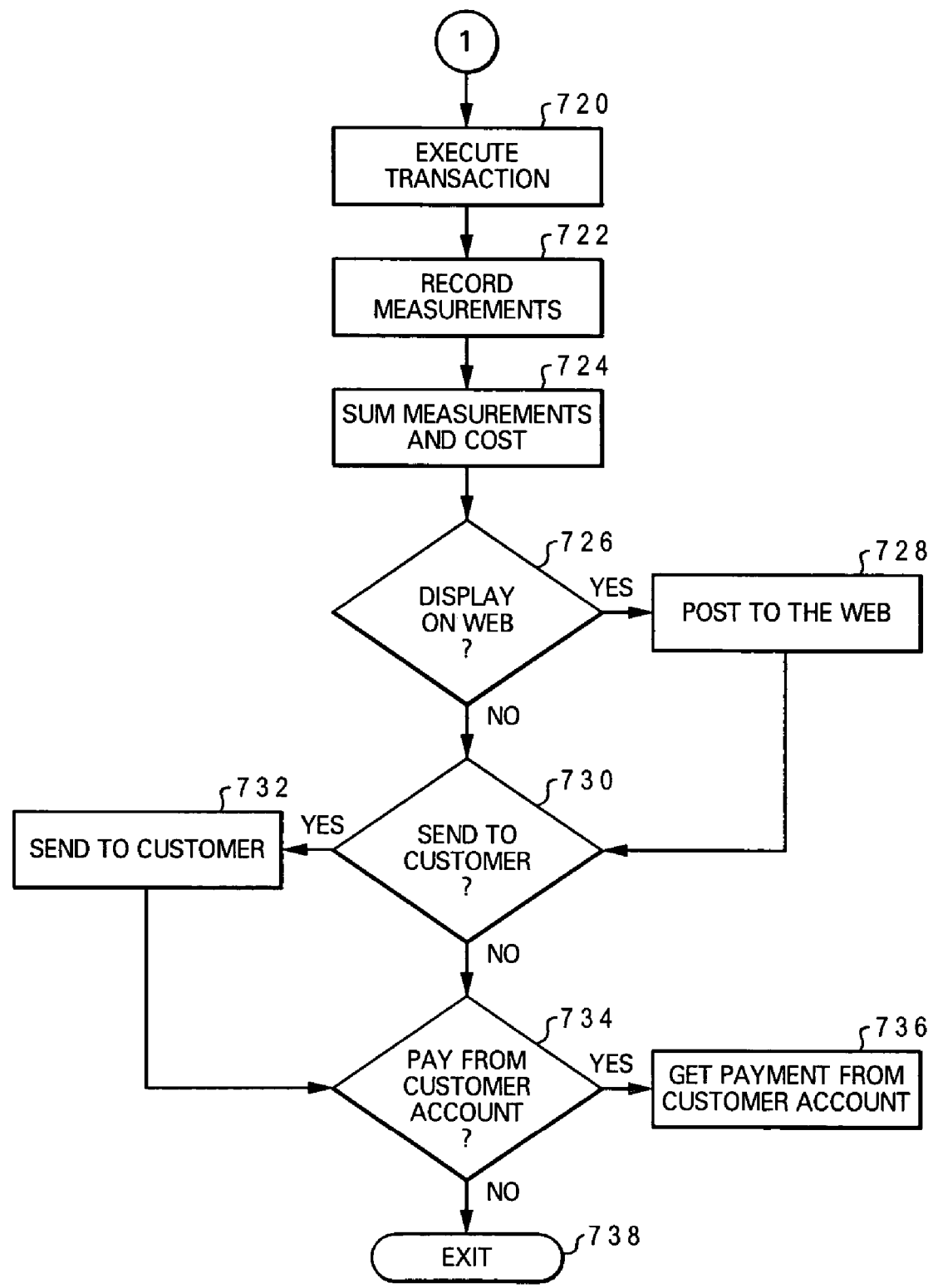

With reference now to FIG. 7, initiator block 702 begins the On Demand process. A transaction is created than contains the unique customer identification, the requested service type and any service parameters that further, specify the type of service (block 704). The transaction is then sent to the main server (block 706). In an On Demand environment the main server can initially be the only server, then as capacity is consumed other servers are added to the On Demand environment.

The server central processing unit-(CPU) capacities in the On Demand environment are queried (block 708). The CPU requirement of the transaction is estimated, then the servers available CPU capacity in the On Demand environment are compared to the transaction CPU requirement to see if there is sufficient CPU available capacity in any server to process the transaction (query block 710). If there is not sufficient server CPU available capacity, then additional server CPU capacity is allocated to process the transaction (block 712). If there was already sufficient Available CPU capacity then the transaction is sent to a selected server (block 714).

Before executing the transaction, a check is made of the remaining On Demand environment to determine if the environment has sufficient available capacity for processing the transaction. This environment capacity consists of such things as but not limited to network bandwidth, processor memory, storage etc. (block 716). If there is not sufficient available capacity, then capacity will be added to the On Demand environment (block 718). Next the required software to process the transaction is accessed, loaded into memory, then the transaction is executed (block 720).

The usage measurements are recorded (block 722). The usage measurements consist of the portions of those functions in the On Demand environment that are used to process the transaction. The usage of such functions as, but not limited to, network bandwidth, processor memory, storage and CPU cycles are what is recorded. The usage measurements are summed, multiplied by unit costs and then recorded as a charge to the requesting customer (block 724).

If the customer has requested that the On Demand costs be posted to a web site (query block 726), then they are posted (block 728). If the customer has requested that the On Demand costs be sent via e-mail to a customer address (query block 730), then these costs are sent to the customer (block 732). If the customer has requested that the On Demand costs be paid directly from a customer account (query block 734), then payment is received directly from the customer account (block 736). The On Demand process is then exited at terminator block 738.

What is claimed is:

1. A method for performing verification, said method comprising:
   receiving a design;
   building an intermediate binary decision diagram for said design containing one or more nodal binary decision diagrams;
   in response to a size of said intermediate binary decision diagram exceeding a size threshold, selecting a node of said design for case-splitting;
   first case-splitting upon said selected node of said design to generate a primary constraint for setting said selected node to a primary value, wherein said first case-splitting upon said selected node comprises first case-splitting upon said selected node of said design at an identified time step to generate said primary constraint for setting said determined node to said primary selected value;
   first constraining one of said one or more nodal binary decision diagrams with said primary constraint to generate a primary final binary decision diagram; and
   first performing verification of said design using said primary final binary decision diagram.

2. The method of claim 1, further comprising:
   second case-splitting upon said selected node of said design to generate a secondary constraint for setting said determined node to a secondary value;
   second constraining said one of said one or more nodal binary decision diagrams with said secondary constraint to generate a secondary final binary decision diagram; and
   second performing verification of said design using said secondary final binary decision diagram.

3. The method of claim 2, wherein:
   said step of selecting said node of said design for said first case-splitting further comprises selecting a set of multiple nodes of said design for said first case-splitting and said second case-splitting; and
   repeating said first case-splitting, first constraining, first performing, second case-splitting, second constraining and second performing steps on each of said set of multiple nodes of said design.

4. The method of claim 1, wherein:
   said step of selecting said node of said design for said first case-splitting further comprises selecting a set of multiple nodes of said design for said first case splitting;
   said method further comprises repeating said first case-splitting, said first constraining, and said first performing steps on each of said set of multiple nodes of said design.

5. The method of claim 1, wherein said step of building said intermediate binary decision diagram for said design further comprises:
   combining one or more intermediate binary decision diagrams of one or more child nodes of said selected node;
   determining that said intermediate binary decision diagram of said selected node is not valid;
   in response to determining that said intermediate binary decision diagram of said selected node is not valid, marking a splittable node;
   setting said splittable node to a value;
   obtaining one or more third binary decision diagrams by inverting said second binary decision diagrams;
   storing said one or more third binary decision diagram on a stack;
   constraining one or more second binary decision diagrams with an inverse of one or more of said one or more third binary decision diagram of said splittable node; and
   constraining one or more fourth binary decision diagrams with a fifth binary decision diagram of said splittable node.

6. The method of claim 5, further comprising:
   retrieving said third binary decision diagrams said stack;
   setting said splittable node to a next constant; and
   performing symbolic analysis of said design with said next constant.

7. A method for performing verification, said method comprising:
   receiving a design;
   building an intermediate binary decision diagram for said design containing one or more nodal binary decision diagrams;
   in response to a size of said intermediate binary decision diagram exceeding a size threshold, selecting a node of said design for case-splitting;
   first case-splitting upon said selected node of said design to generate a primary constraint for setting said selected node to a primary value;
   first constraining one of said one or more nodal binary decision diagrams with said primary constraint to generate a primary final binary decision diagram;
   first performing verification of said design using said primary final binary decision diagram;
   backtracking to a time step of a last case-split;
   setting said selected node to a next constant; and
   performing a symbolic analysis of said determined node with said next constant.

* * * * *